(12) United States Patent
Eissner

(10) Patent No.: US 11,181,565 B2
(45) Date of Patent: Nov. 23, 2021

(54) METHOD AND DEVICE FOR MEASURING AT LEAST ONE PROPERTY OF A COIL, METHOD AND DEVICE FOR MEASURING THE POSITION OF AN ACTUATION MEMBER, AND MOTOR VEHICLE

(71) Applicant: KNORR-BREMSE SYSTEME FUER NUTZFAHRZEUGE GMBH, Munich (DE)

(72) Inventor: Markus Eissner, Eschenbach (DE)

(73) Assignee: KNORR-BREMSE SYSTEME FUER NUTZFAHRZEUGE GMBH, Munich (DE)

(*) Notice: Subject to any disclaimer, the term of this patent is extended or adjusted under 35 U.S.C. 154(b) by 129 days.

(21) Appl. No.: 16/078,495

(22) PCT Filed: Feb. 20, 2017

(86) PCT No.: PCT/EP2017/053797
§ 371 (c)(1),
(2) Date: Aug. 21, 2018

(87) PCT Pub. No.: WO2017/144414
PCT Pub. Date: Aug. 31, 2017

(65) Prior Publication Data
US 2019/0049499 A1    Feb. 14, 2019

(30) Foreign Application Priority Data

Feb. 22, 2016 (DE) .................. 10 2016 103 075.9

(51) Int. Cl.
*G01R 27/26* (2006.01)
*G01D 5/20* (2006.01)
(Continued)

(52) U.S. Cl.
CPC ....... *G01R 27/2611* (2013.01); *G01D 5/2013* (2013.01); *G01D 18/004* (2013.01); *G01R 35/005* (2013.01)

(58) Field of Classification Search
CPC ....... E21B 47/0228; G01S 13/88; G01V 3/00; G01V 3/08; G01V 3/15; G01V 3/165; G06K 7/10158
See application file for complete search history.

(56) References Cited

U.S. PATENT DOCUMENTS

| 4,103,233 A | 7/1978 | Timmermans et al. |
| 4,649,341 A | 3/1987 | Ulbrich et al. |

(Continued)

FOREIGN PATENT DOCUMENTS

| CN | 87216550 U | 10/1988 |
| CN | 1067741 A | 1/1993 |

(Continued)

OTHER PUBLICATIONS

International Search Report dated Aug. 1, 2017, of the corresponding International Application PCT/EP2017/053797 filed Feb. 20, 2017.

*Primary Examiner* — Nasima Monsur
(74) *Attorney, Agent, or Firm* — Norton Rose Fulbright US LLP; Gerard Messina; Aaron Deditch

(57) ABSTRACT

A method for measuring a coil property, modeled as a parallel-circuit including a capacitance with a series-circuit including a DC-voltage and frequency-dependent resistance, and an inductance and current-voltage converter series connected, by: applying an AC-voltage, having a first-frequency and a DC-voltage component, to the coil and a voltage at the current-voltage converter is captured at a second-frequency, and the impedance and phase-angle at the first-frequency are derived from n-measured values; and applying an AC-voltage, having a third-frequency differing from the first and
(Continued)

having a DC-voltage component, to the coil and voltage at the current-voltage converter is captured at the second or fourth-frequencies, in which the impedance and phase-angle at the third-frequency are derived from m-measured values for the DC-voltage resistance.

12 Claims, 12 Drawing Sheets

(51) Int. Cl.
  *G01D 18/00* (2006.01)
  *G01R 35/00* (2006.01)

(56) References Cited

U.S. PATENT DOCUMENTS

| | | | |
|---|---|---|---|
| 6,469,500 B1 | 10/2002 | Schmitz et al. | |
| 7,053,603 B2 | 5/2006 | Swart | |
| 2004/0187625 A1* | 9/2004 | Schiel | B60T 7/042 74/514 |
| 2007/0216405 A1* | 9/2007 | Takeuchi | D06H 3/00 324/228 |
| 2009/0189600 A1* | 7/2009 | Kurkovskiy | H03K 17/9505 324/207.16 |
| 2009/0319212 A1* | 12/2009 | Cech | B60R 21/0136 702/65 |
| 2015/0300843 A1 | 10/2015 | Hunter et al. | |

FOREIGN PATENT DOCUMENTS

| | | |
|---|---|---|
| CN | 103049005 A | 4/2013 |
| CN | 103886923 A | 6/2014 |
| CN | 104654994 A | 5/2015 |
| DE | 102005034859 A1 | 2/2007 |
| DE | 102008042095 A1 | 3/2010 |
| DE | 102010036126 B3 | 2/2012 |
| FR | 2565695 A1 | 12/1985 |
| JP | 2000180109 A | 6/2000 |
| JP | 2001027505 A | 1/2001 |
| RU | 2474786 C1 | 1/2013 |
| SU | 659993 A1 | 4/1979 |
| WO | 93/011369 A1 | 6/1993 |
| WO | 2013/110145 A1 | 8/2013 |

* cited by examiner

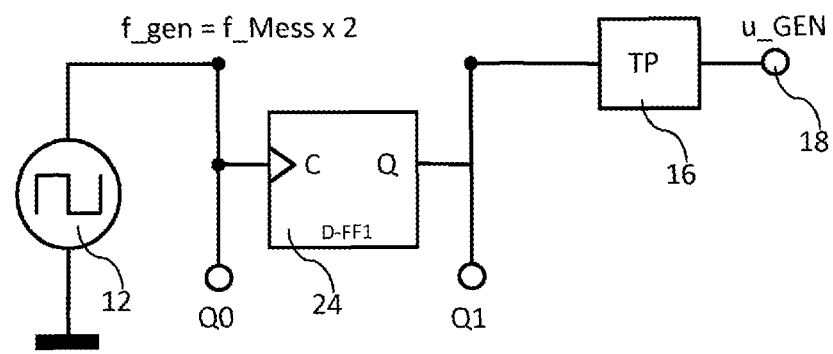
Fig. 6
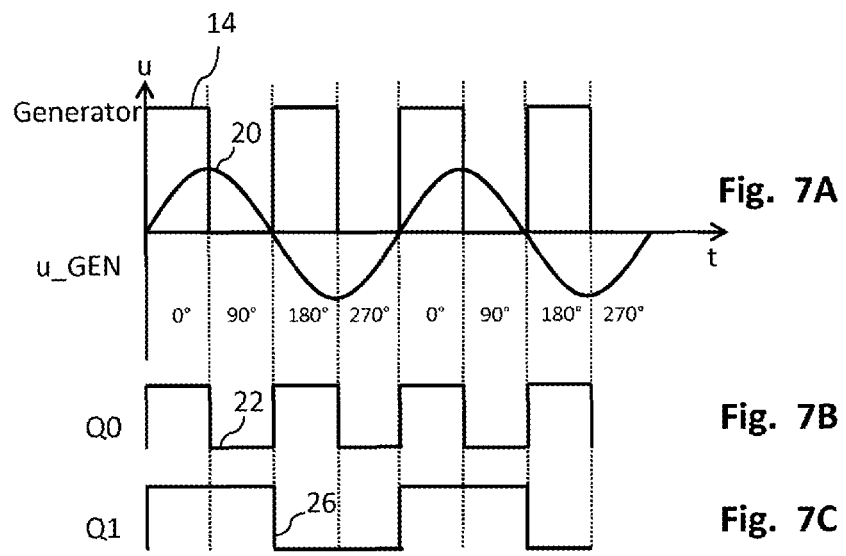
Fig. 7A
Fig. 7B
Fig. 7C

METHOD AND DEVICE FOR MEASURING AT LEAST ONE PROPERTY OF A COIL, METHOD AND DEVICE FOR MEASURING THE POSITION OF AN ACTUATION MEMBER, AND MOTOR VEHICLE

FIELD OF THE INVENTION

The present invention relates to a method and a device for measuring at least one property of a coil, which may be a measuring coil used during measurements of other variables, for instance a coil into which an actuation member on a pedal in a motor vehicle, for example, plunges or over which such an actuation member slides. Accordingly, the invention also relates to a method and a device for measuring a position of such an actuation member. Finally, the device also relates to a motor vehicle with an actuation element having an actuation member.

BACKGROUND INFORMATION

It is discussed, for example, in patent document U.S. Pat. No. 6,469,500 B1, how to determine the position and possibly the speed of an actuation member, which can be moved back-and-forth, with the aid of a coil into which this actuation member plunges. In patent document U.S. Pat. No. 6,469,500 B1, the actuation member has a permanent magnet. A change in the impedance of the coil or of the current flowing through the coil is captured as a signal for capturing the position of the actuation member.

For such travel sensors, U.S. Pat. No. 7,053,603 B2 discusses the practice of also capturing and considering a temperature dependence of the non-reactive resistance of the coil.

Patent document DE 10 2010 036 126 B3 generally discusses a method for determining at least one characteristic value for a coil characteristic variable of a microcoil, wherein the microcoil is not wired to a corresponding measuring device. Frequencies are run through and the frequency response for an antenna input impedance is measured here and is compared with a frequency response determined by an analytical model for the microcoil.

Coils into which actuation members on a pedal in a motor vehicle, for example, plunge or over which such actuation members slide are conventionally sealed in a watertight manner in order to avoid the ingress of water. Water can considerably change the value of the capacitance of the coil and can therefore distort measurement results. It is very complicated and expensive to seal such coils. A way of being able to dispense with such sealing is sought.

SUMMARY OF THE INVENTION

Accordingly, an object of the present invention is to provide a reliable method for measuring at least one property of a coil, wherein such a property which is dependent on the moisture in the coil can be determined, for example. The object is also to provide a corresponding device. Furthermore, the object of the invention is to facilitate a position measurement (or travel measurement) with respect to an actuation member which plunges into such a measuring coil, in particular if the measuring coil is not sealed in a watertight manner. An actuation member can also slide over such a measuring coil in an alternative manner or with another of its sections. The object is also to provide a corresponding device. The object finally includes providing corresponding motor vehicles having corresponding coils and actuation members in which it is possible to dispense with sealing of the coils.

This object may be achieved by a method having the features described herein and by a device having the features described herein and by a motor vehicle having the features described herein.

According to one aspect of the invention for which protection is sought independently and in combination with other aspects of the invention, the object is achieved by a method for measuring at least one property of a coil, which may be a measuring coil used during measurements of other variables. According to the invention, the coil is modeled as a parallel circuit firstly comprising a capacitance with secondly a series circuit comprising a DC voltage resistance, a frequency-dependent resistance and an inductance. (This comprises an abstract consideration which results, however, in a subsequent request for the corresponding variables.) A current-voltage converter is connected in series with the coil. An AC voltage having a first frequency and having a DC voltage component which differs from zero (that is to say having a DC voltage offset) is then applied to the coil and the voltage at the current-voltage converter is captured (sampled) at a second frequency which is four times or a multiple of four times the first frequency. The impedance and the phase angle at the first frequency are derived from at least four of the measured values captured in succession in this manner. A value for the DC voltage resistance, the frequency-dependent resistance and/or the inductance can then be derived from these variables. Alternatively, the second frequency may also be a higher multiple than four times the first frequency, that is to say an n-tuple of the first frequency, where n is a natural number greater than 4, and the impedance and phase angle are then derived from at least n measured values captured in succession.

An AC voltage having a third frequency which differs from the first frequency and having a DC voltage component which differs from zero (that is to say having a DC voltage offset) may be additionally or subsequently applied to the coil and the voltage at the current-voltage converter is captured (sampled) at the second frequency or at a fourth frequency which is four times or a higher multiple of the first frequency, and the impedance and the phase angle at the third frequency are derived from at least four or even more of the measured values captured in succession in this manner. In this case, the value for the DC voltage resistance, the frequency-dependent resistance and/or the inductance can then be derived from the two impedances and from the two phase angles. In the case of a total of eight values, the three variables can be determined reliably, that is to say with a small measurement error. The above-mentioned model of the coil as a parallel circuit firstly comprising a capacitance with secondly a series circuit comprising a DC voltage resistance, a frequency-dependent resistance and an inductance is therefore justified by the calculation of the corresponding latter variables.

In one advantageous embodiment, the AC voltage in both steps or the AC voltage at the first and third frequencies can be respectively a sinusoidal voltage, wherein the voltages differ from one another in terms of their frequency. In this case, it has proved to be particularly efficient if the third frequency is three times the first frequency.

The different frequencies can also be provided by a square-wave voltage which is passed through different filters, namely by allowing through the fundamental and the third harmonic (at three times the frequency of the fundamental).

The four (or more) measured values captured in succession at four times the frequency or higher multiples of the frequency are intended to sample the current or voltage in phase at angular spacings of 90° with respect to the phase of the AC voltage. This sampling may be carried out for the phase values of 0°, 90°, 180° and 270°. Other values are nevertheless possible; for example, sampling could be carried out at 15°, 105°, 195° and 285° or the like.

According to a second aspect of the invention for which protection is sought independently and in combination with other aspects of the invention, in particular in combination with the previously described aspect of the invention, a method for measuring a position of an actuation member is provided, wherein at least sections of the actuation member plunge into a measuring coil in at least one measurable position and/or at least sections slide over a measuring coil, that is to say change the extent to which the actuation member surrounds the coil, and wherein the position is derived from an inductance of the measuring coil. According to the invention, the respective imaginary parts of the impedance of the measuring coil are determined at at least two different frequencies and an ideal inductance independent of a capacitance of the measuring coil is determined therefrom. This ideal inductance is dependent only on mechanical variables such as the travel (position of the measuring coil), and possibly also on the temperature. Accordingly, the position is derived using this ideal inductance in the method.

Disregarding the resistances which are likewise present in a model of the coil, namely the "DC voltage resistance" and the "frequency-dependent resistance", it is possible to derive the following formula from which the ideal inductance $L0$ at the first frequency $\omega_1$ with a corresponding impedance $Z_1$ and a corresponding imaginary part $\text{Im}\{Z_1\}$ and at the second frequency $\omega_2$ with the impedance $Z_2$ and the corresponding imaginary part $\text{Im}\{Z_2\}$ is calculated:

$$L_0 = \frac{\text{Im}\{Z_1\} \cdot \text{Im}\{Z_2\} \cdot \left(\frac{\omega_1}{\omega_2} + \frac{\omega_2}{\omega_1}\right)}{\omega_2 \text{Im}\{Z_1\} - \omega_1 \text{Im}\{Z_2\}}$$

If the ideal inductance is temperature-dependent, one advantageous embodiment can also provide for the temperature to be measured, wherein the measured value for the temperature can be used when determining the position.

The two impedances can be determined in accordance with the method according to the first aspect of the invention, that is to say with four (or more) measured values in each case at both frequencies which represent the voltage at the current-voltage converter precisely in phase at 90° spacings (or corresponding smaller spacings).

In the device according to the invention for measuring at least one property of a coil, the third aspect of the invention, for which protection is likewise sought independently and in combination with other aspects of the invention, provides a current-voltage converter (which may be in the form of a simple measuring resistor) which is to be connected in series with the coil, also a generator for an input AC voltage which has a DC voltage component, a frequency converter, a sampling circuit for the output signal from the current-voltage converter, which sampling circuit carries out sampling in phase with the input AC voltage at four times the frequency or at a higher multiple than four times the frequency of the input AC voltage, and finally an evaluation device which is supplied with the measured values sampled by the sampling circuit and calculates, by modeling the coil as a parallel circuit firstly comprising a capacitance with secondly a series circuit comprising a DC voltage resistance, a frequency-dependent resistance and an inductance, the value(s) for the DC voltage resistance, for the frequency-dependent resistance and/or for the inductance.

The frequency converter may be a frequency multiplier or a frequency divider which can be optionally switched on.

In one embodiment, the sampling circuit can respectively comprise a low-pass filter downstream of the output of the frequency converter and downstream of the output of the current-voltage converter, and the outputs of both low-pass filters can be supplied to a multiplexer, the output of which can be supplied to an analog/digital converter, the output of which can in turn be supplied to a microprocessor evaluation device. In an alternative embodiment, the sampling circuit can jointly supply the output signal from the frequency converter and from the current-voltage converter to a multiplexer, the output signal from which can first of all pass through a low-pass filter, the output of which can be supplied to a first analog/digital converter, the output of which can in turn be supplied to a microprocessor as an evaluation device, and the output signal from the multiplexer can be secondly supplied to a bandpass filter, the output signal from which can be supplied either to the same first analog/digital converter or to a second analog/digital converter, the output signal from which can in turn be supplied to the microprocessor.

The first embodiment with the two early low-pass filters has the advantage that interference signals can be filtered out very early. The embodiment with the multiplexer at the start has the advantage that it is possible to carry out measurements in a very phase-accurate manner.

The device for measuring a position of an actuation member having a measuring coil into which the actuation member plunges in at least one position to be measured has, according to a fourth aspect of the invention for which protection is sought independently and in combination with other aspects, a device for measuring the impedance of the measuring coil or at least the imaginary part of the impedance of the measuring coil at two different frequencies for the purpose of determining an ideal inductance of the coil, which ideal inductance is independent of the capacitance of the measuring coil, and an apparatus for determining the position of the actuation member from this ideal inductance, which can also be actually derived on account of the property of the ideal inductance.

In this device, the measuring coil need not be sealed in a watertight manner since the capacitance is subtracted before determining the position of the actuation member and since ingressing moisture mainly influences the capacitance.

The device for measuring at least one property of a coil according to the above-described third aspect of the invention can be used in the device for measuring a position of an actuation member.

A motor vehicle according to the invention has an actuation element having an actuation member and a device for measuring a position of the actuation member of the type according to the invention. At least sections of the actuation member of the actuation element plunge into the measuring coil of the device for measuring a position of the actuation member and/or at least sections slide over said measuring coil, and a reaction of a unit of the motor vehicle is prompted on the basis of the position of the actuation member at least under predetermined conditions. The actuation element may be a brake or gas pedal or another element of a motor vehicle, the position, that is to say distance and/or angle, of which can be changed and is intended to be determined.

In addition to using the various aspects of the present invention in the claimed motor vehicle, the invention can also be used in other industrial applications in which coils can be used as comparable position sensors, such as in mechanical engineering, for example in machine tools, or in measuring or test devices. In the accompanying drawings, in a schematic manner, the exemplary embodiments are shown.

Further advantages, characteristics and features of the present invention become clear in the following description of exemplary embodiments, in which case the invention is not restricted to these exemplary embodiments.

BRIEF DESCRIPTION OF THE DRAWINGS

FIG. 6 shows a circuit diagram illustrating the basic principle of the voltage generation used in one embodiment of the invention.

FIGS. 7A, 7B, and 7C show the voltages tapped off at a plurality of points shown in FIG. 6.

DETAILED DESCRIPTION

Figure 1:
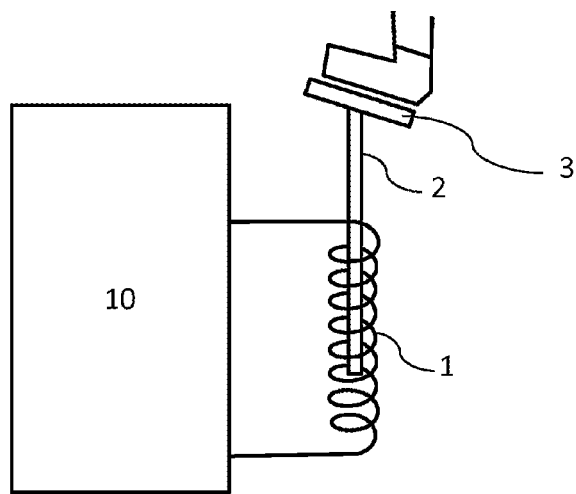
FIG. 1 shows the principle of travel measurement in a pedal, on which the present invention is based in some aspects.

FIG. 1 shows an actuation member 2 on a pedal 3 which penetrates a coil 1, as used in a motor vehicle for example, and a device 10 for reading the travel signal from the coil 1.

Figure 2:
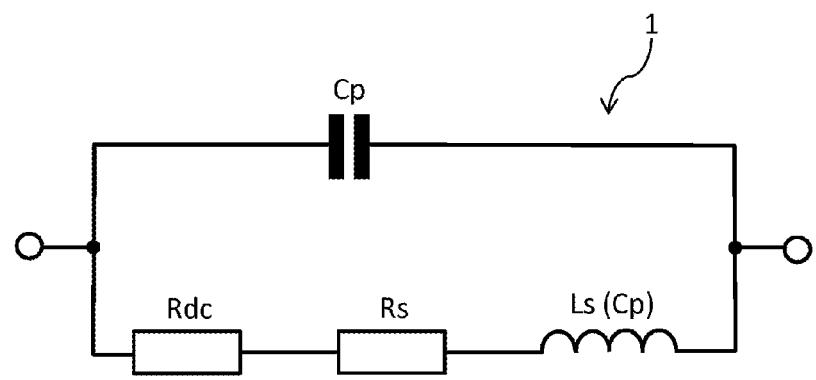
FIG. 2 shows an equivalent circuit diagram according to which a measuring coil provided by the principle according to FIG. 1 is modeled.

As illustrated in FIG. 2, the coil 1 may be modeled as a parallel circuit firstly comprising a capacitance Cp and secondly a series circuit comprising a DC voltage resistance Rdc, a frequency-dependent resistance Rs and an inductance Ls. The variable Ls is dependent on mechanical properties, in particular is dependent on the travel, that is to say is dependent on the position of the actuation member 2 of the pedal 3, and is also dependent on the temperature, for example. Rs is also dependent on the travel. It is also dependent on the mechanism and on the interturn fault. The DC voltage resistance Rdc is dependent on the temperature of the coil 1 and the contact resistance thereon. The capacitance Cp of the turns of the coil 1 depends mainly on the moisture prevailing in the coil.

The present invention describes a possible way of being able to depart from the conventional principle of keeping the capacitance Cp constant by sealing the coil 1 in a watertight manner.

Figure 3A:
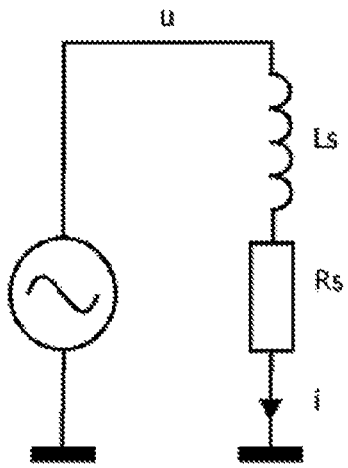
FIG. 3A shows a basic circuit diagram of an inductance connected in series with a resistance.
Figure 3B:
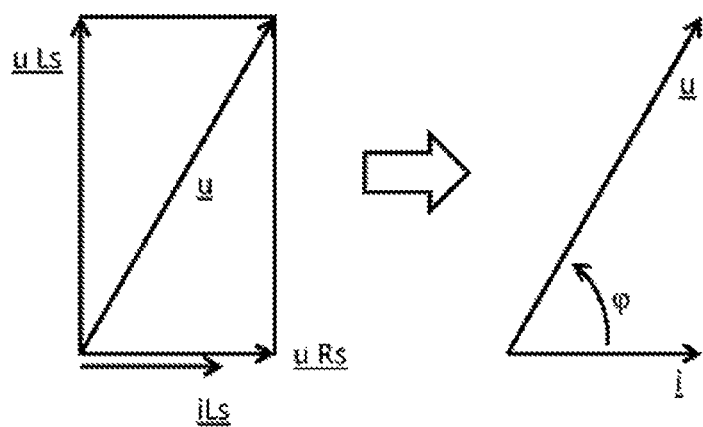
FIG. 3B shows a matching phasor diagram with phasors for the current and voltage.

As known, a series circuit comprising an inductance Ls and a frequency-dependent resistance Rs, as illustrated in the basic diagram in FIG. 3A, can be represented by a phasor diagram shown in FIG. 3B when an AC voltage U is applied. The resulting voltage has an angle (phase angle φ) and an absolute value. The impedance can be calculated from the angle φ and the absolute value.

Figure 4A:
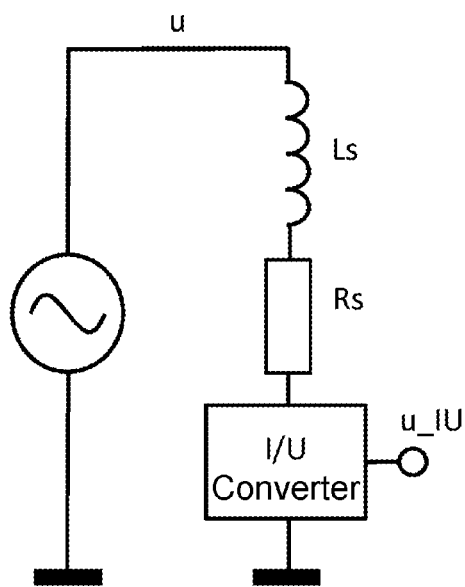
FIG. 4A shows a modification of the basic circuit from FIG. 3A with a current-voltage converter.
Figure 4B:
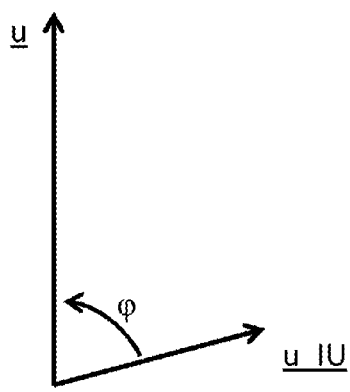
FIG. 4B shows a matching phasor diagram.

In the less idealized basic diagram, there is additionally a current-voltage converter at which the voltage u_IU can be tapped off, see FIG. 4A and the associated phasor diagram in FIG. 4B. In this case too, the phase angle φ can be determined, now in the relationship of two voltages u and u_IU.

Figure 5A:
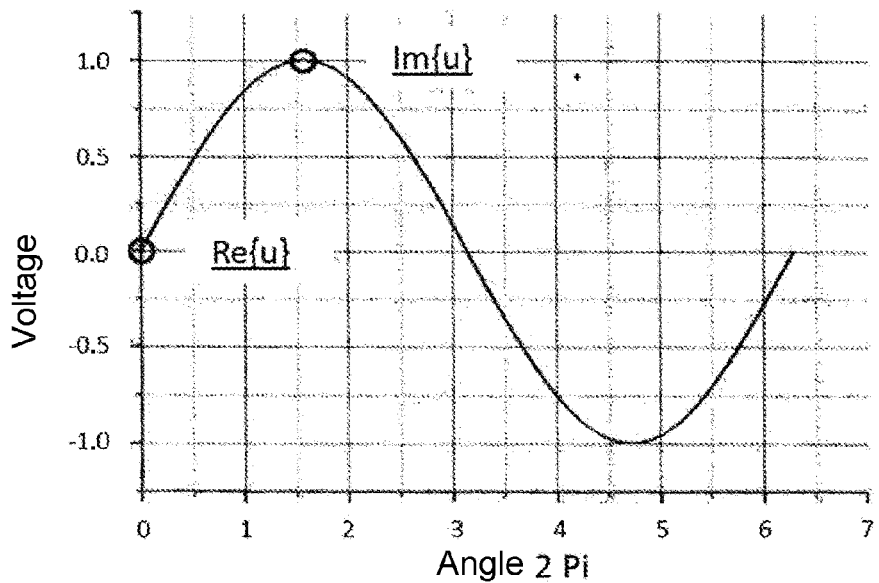
FIG. 5A shows the principle of sampling measured values with a 90° spacing.
Figure 5B:
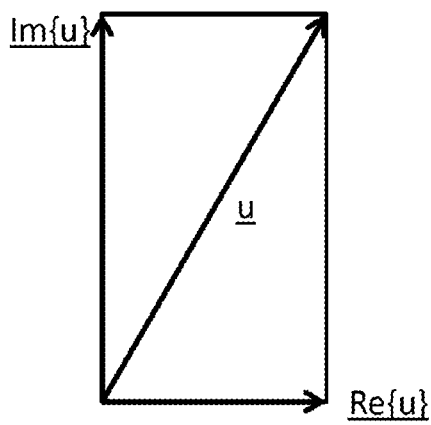
FIG. 5B shows a matching phasor diagram.

The phasor representations shown in FIGS. 3B and 4B are snapshots for an AC voltage; during operation, the phasor rotates at a constant rotational frequency $\omega_1$ (the frequency of the AC voltage), with the result that the real part of the phasor can be read at a particular phase angle and the imaginary part can be read at another phase angle which is offset by 90°. This becomes clear on the basis of FIG. 5A where the real part can be read at an angle of zero (measured in arc lengths, that is to say one full revolution is 2π, 6.28 . . . ), and the imaginary part can be read at an angle of 90° (π/2). FIG. 5B shows the corresponding phasor diagram.

The invention is based on the knowledge that the impedance and the phase angle can be derived from corresponding measurements of real and imaginary parts and the variables Rdc, Rs and Ls can be calculated therefrom.

The embodiment is based on the idea that measured values are intended to be sampled at 0°, 90°, 180° and 270°. In this respect, FIG. 6 shows a basic diagram of the corresponding voltage generator complex.

A voltage generator 12 generates a square-wave voltage 14 (FIG. 7A) which is passed through a low-pass filter 16, the output 18 of which outputs the generator voltage u_GEN (see curve 20 in FIG. 7A). The voltage 22 (FIG. 7B) shown in FIG. 7B is tapped off at a tap Q0 upstream of the low-pass filter, wherein a frequency divider 24 is followed by an output Q1, where the voltage 26 (FIG. 7C) can be tapped off. It is possible to carry out sampling at an angle of 90° by using the variables Q0 and Q1.

Figure 8:
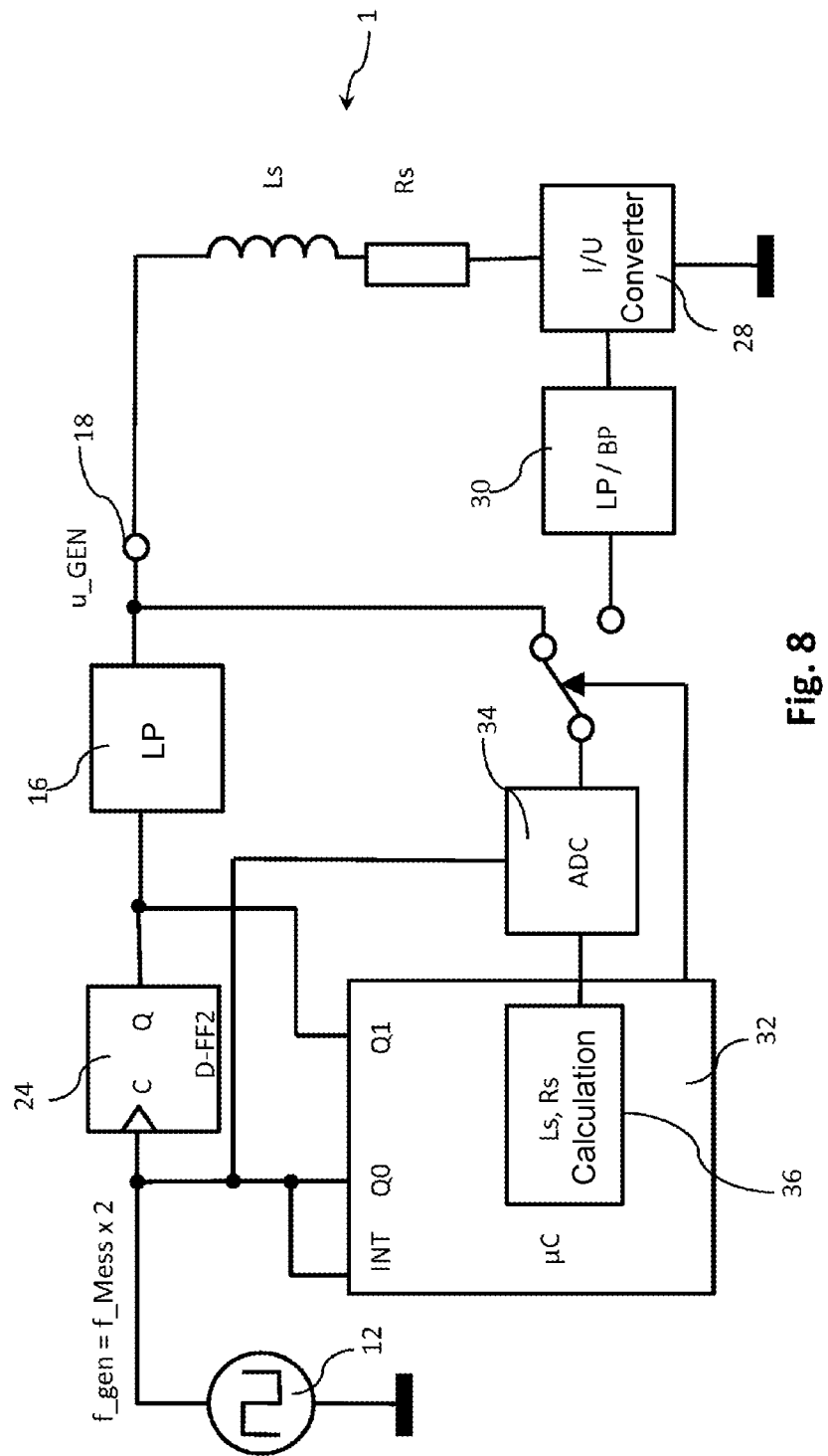
FIG. 8 shows a basic circuit diagram of a circuit which is used to carry out the method for determining at least one property of the measuring coil using the principle explained on the basis of FIG. 6.

The complete diagram is shown in FIG. 8. A current-voltage converter 28 which is in the form of a simple measuring resistor R_FP, for example, is connected in series with the coil 1 which is connected to the output 18. The current-voltage converter is followed by a low-pass filter or bandpass filter 30. A microprocessor 32 receives the voltages according to FIGS. 7B and 7C at its inputs Q0 and Q1 and controls the supply of signals to an analog/digital converter 34 (that is to say the sampling) which is in turn also supplied with the original square-wave voltage 14. The microprocessor 32 contains a unit 36 which calculates the values Rs and Ls and possibly also Rdc.

Figure 9:
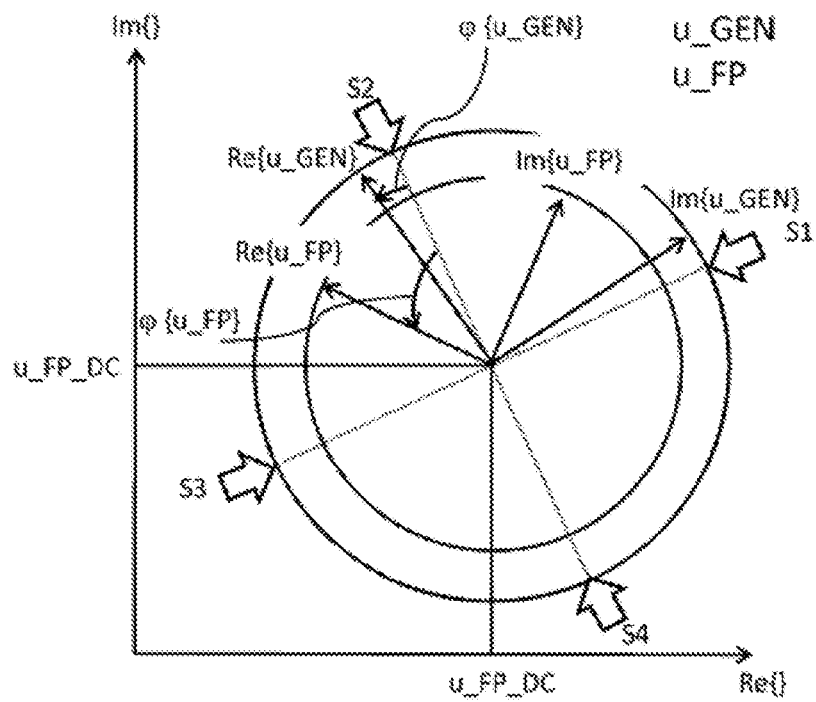
FIG. 9 shows a phasor diagram used to explain the invention.

As stated above, the voltage is intended to be sampled at angular spacings of 90°. This is illustrated in FIG. 9 using the samples S1, S2, S3 and S4. It should be noted that, on account of the square-wave voltage, a DC voltage component which differs from zero is impressed on the overall system. The DC voltage component in the generator voltage results as:

$$\emptyset U\_GEN\_DC = \frac{\frac{u_{GEN_{0°}} + U_{GEN_{180°}}}{2} + \frac{u_{GEN_{90°}} + U_{GEN_{270°}}}{2}}{2} \quad (1)$$

and the DC voltage component at the current-voltage converter resistor R_FP accordingly results as:

$$\emptyset U\_FP\_DC = \frac{\frac{u_{FP_{0°}} + U_{FP_{180°}}}{2} + \frac{u_{FP_{90°}} + U_{FP_{270°}}}{2}}{2} \quad (2)$$

The variables u_GEN 0°, u_GEN 90°, u_GEN 180°, u_GEN 270° are samples for the generator voltage which are measured at the angles with the phases 0°, 90°, 180° and 270°. A corresponding situation applies to the values u_FP_0°, u_FP_90°, u_FP_180°, u_FP_270° for the voltage at the current-voltage converter.

The value Rdc, the DC voltage resistor plunging in the coil 1, can then be derived from the two variables according to:

$$Rdc = \frac{\emptyset u_{GEN_{DC}} * R_{FP}}{\emptyset u_{FP_{DC}}} - R_{FP} \quad (3)$$

With the aid of $\emptyset u_{uGEN\_DC}$ and $\emptyset u_{FP\_DC}$, it is now possible to subtract the DC voltage component from the samples.

An impedance Z results as:

$$Z = \frac{u_{GEN}}{u_{FP}} * R_{FP} - (R_{FP} + Rdc) \quad (4)$$

and the frequency-dependent resistance Rs accordingly results as:

$$R = \frac{u_{GEN_{0°}} * u_{FP_{0°}} + u_{GEN_{90°}} + u_{FP_{90°}}}{u_{FP_{0°}}^2 + u_{FP_{90°}}^2} * R_{FP} - (R_{FP} + Rdc) \quad (5)$$

and the inductance Ls as:

$$Ls = \frac{u_{GEN_{90°}} * u_{FP_{0°}} + u_{GEN_{0°}} + u_{FP_{90°}}}{u_{FP_{0°}}^2 + u_{FP_{90°}}^2} \quad (6)$$

The variable Ls is therefore nothing other than the imaginary part of the respective impedance, Ls=Im{Z}.

Two embodiments of the circuit are explained more specifically in detail below.

Figure 10A:
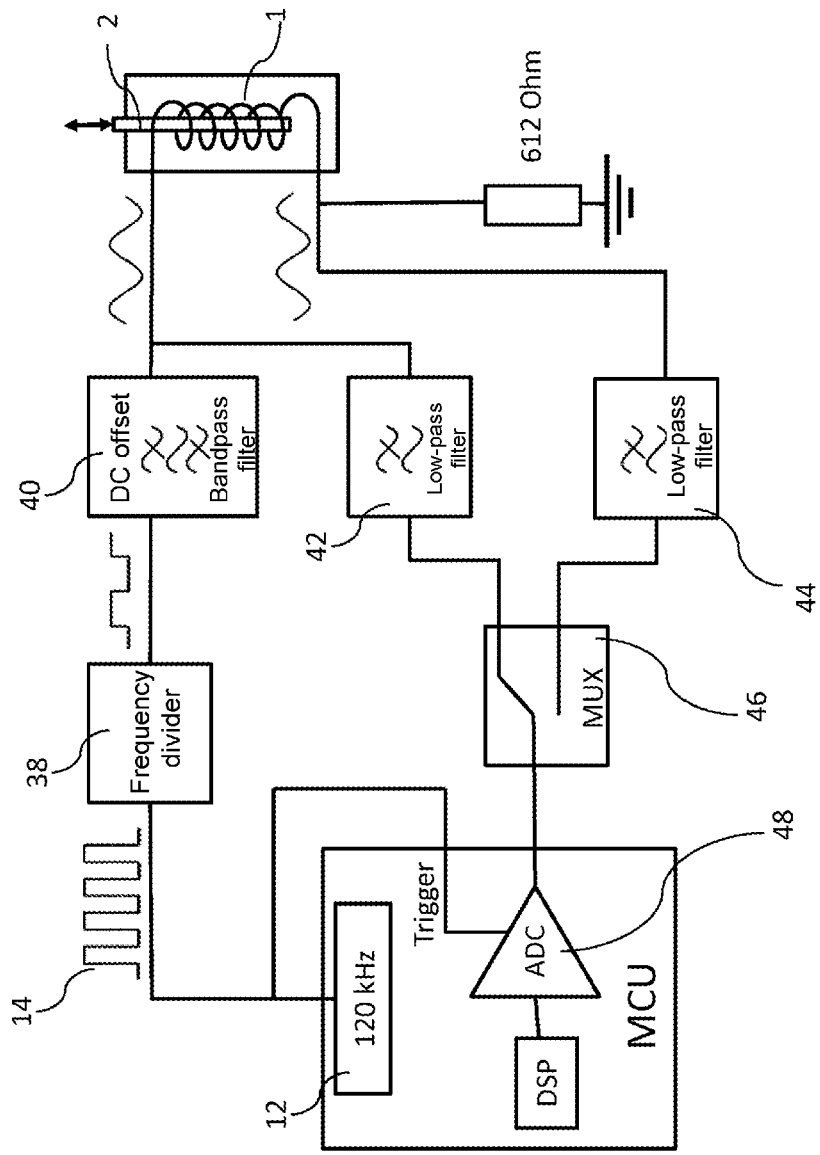
FIG. 10A shows a second embodiment of a circuit according to the invention having a frequency divider.
Figure 10B:
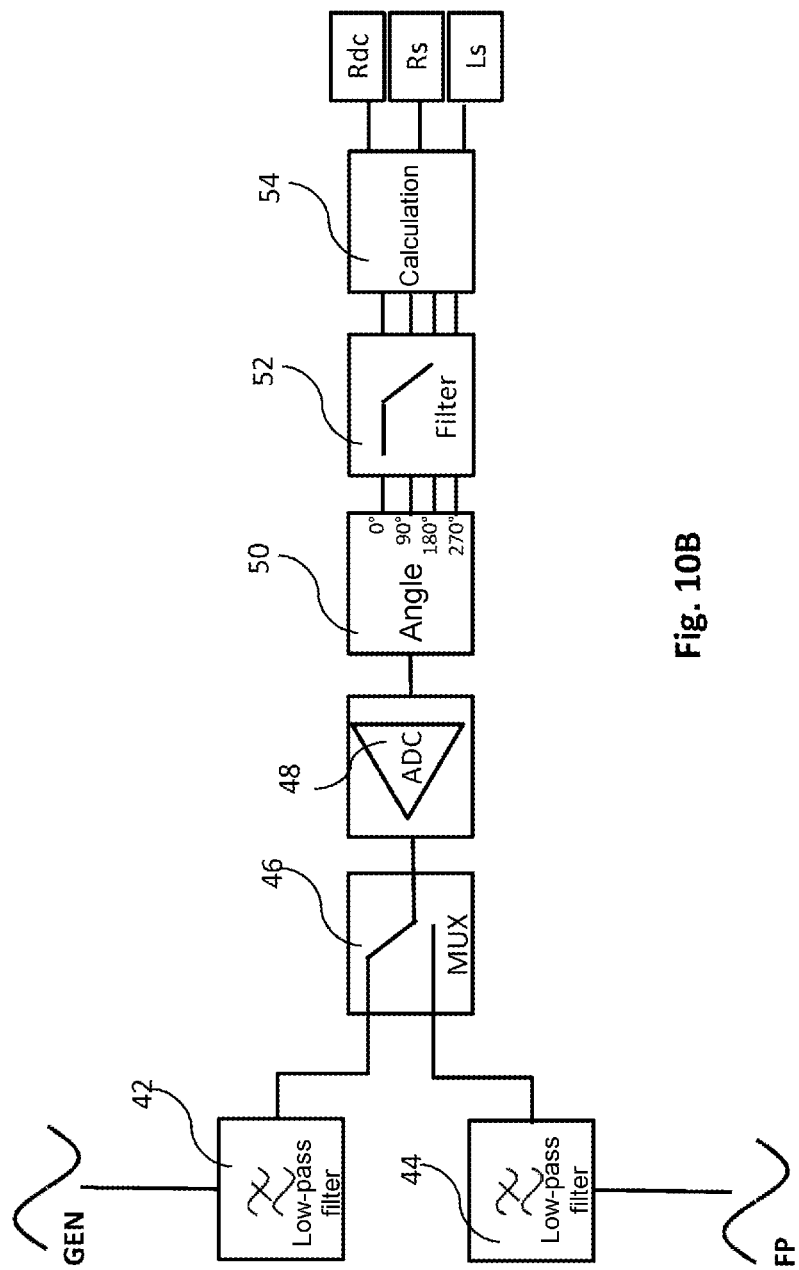
FIG. 10B shows the associated evaluation circuit illustrated in more detail.

FIG. 10A shows that a square-wave voltage generated by the generator 12 at a frequency of 120 kHz in the present example passes through a frequency divider 38, this voltage then passes through a bandpass filter 40 with a DC voltage offset and is supplied to the coil 1. The input signal for the coil (that is to say the output of the bandpass filter 40) passes through a low-pass filter 42, the output signal from the coil passes through a further low-pass filter 44 and the outputs of both low-pass filters are multiplexed with one another in a multiplexer 46, and the result is supplied to an analog/digital converter 48 where an evaluation is then carried out. As illustrated in more detail in FIG. 10B, the angles 0°, 90°, 180° and 270° are read in a unit 50 downstream of the analog/digital converter and then pass through a filter 52 before the calculation 54 is carried out according to the above formulas and the variables Rdc, Rs and Ls are output.

Figure 11A:
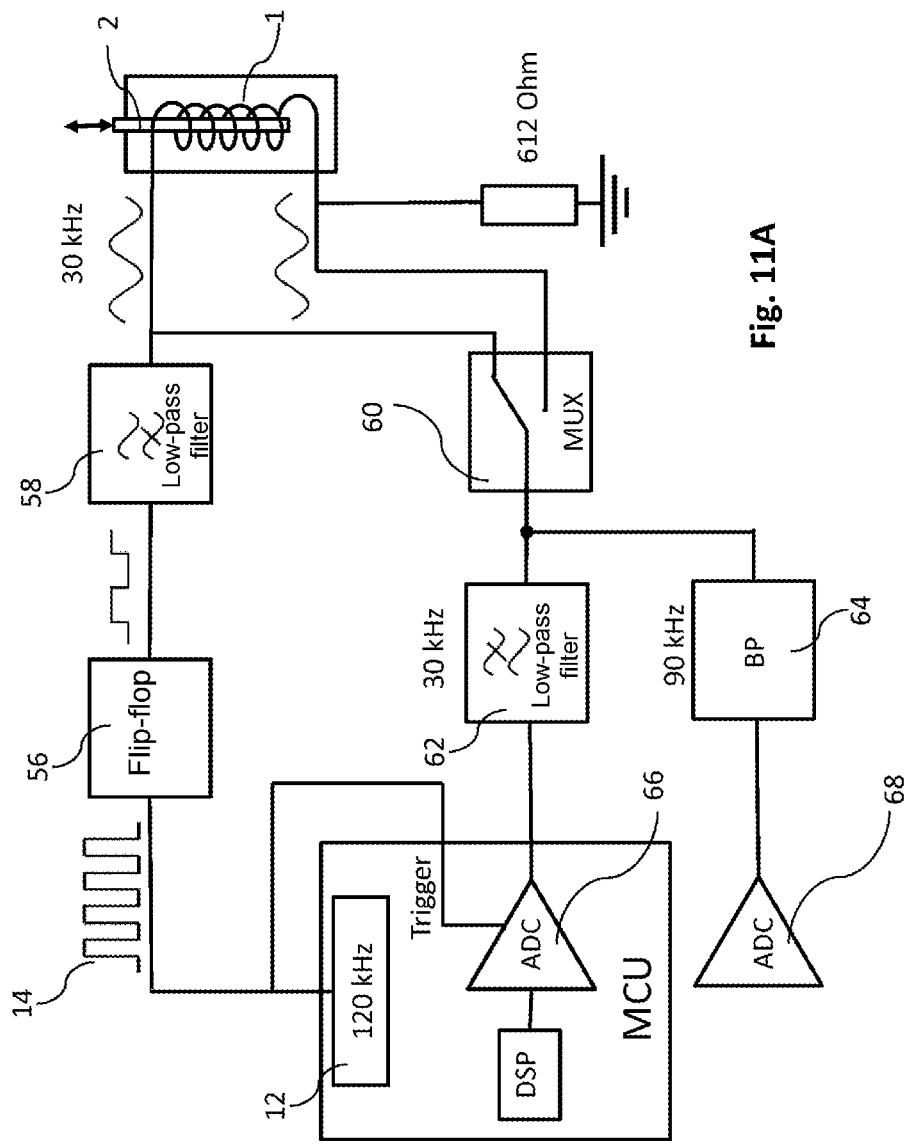
FIG. 11A shows a third embodiment of a circuit according to the invention having a flip-flop.
Figure 11B:
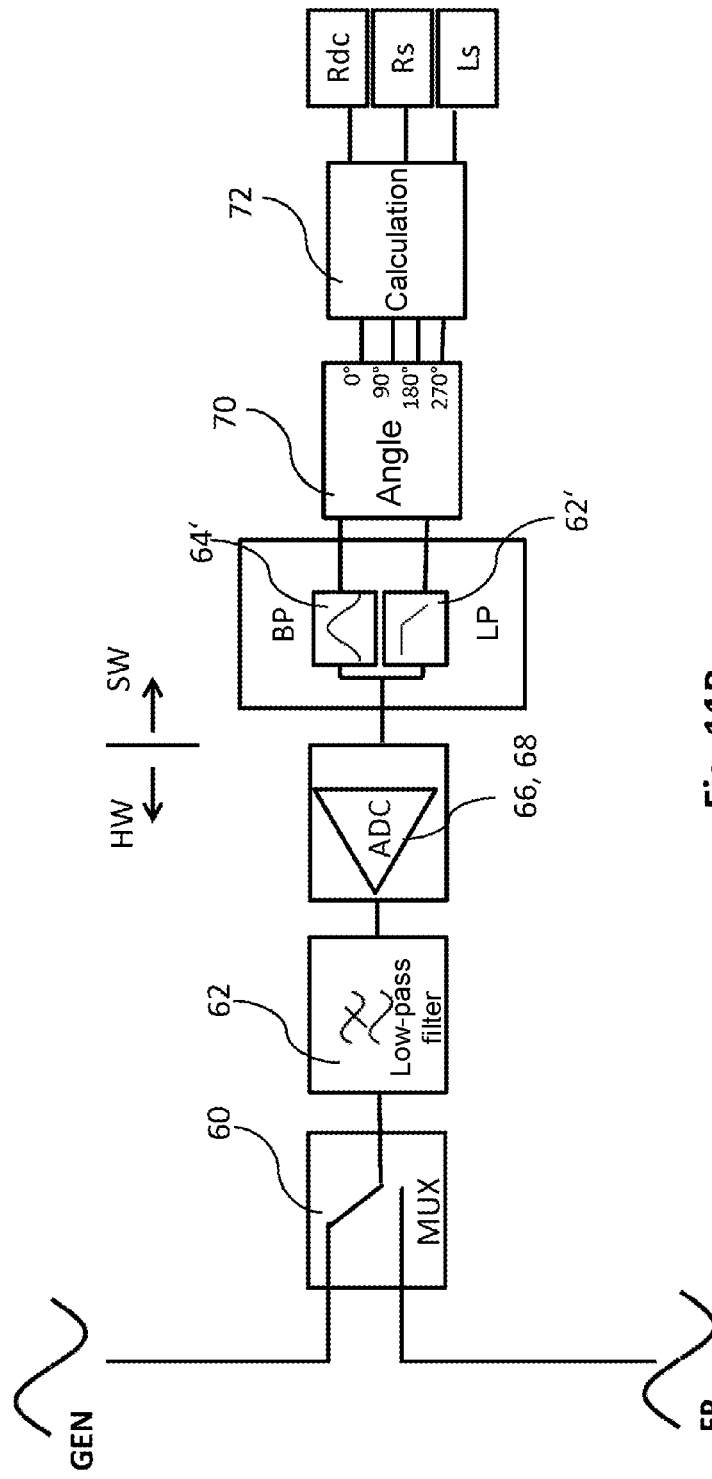
FIG. 11B shows the associated evaluation circuit in detail in the case of a minor modification.

In a modification of the embodiment according to FIG. 10A, the square-wave voltage 14 generated by the generator 12 at 120 kHz in the present example passes through a flip-flop 56 according to FIG. 11A, the output of which is supplied to a low-pass filter 58 where a frequency of 30 kHz is output, for example. The output of the low-pass filter 58 and the output of the coil 1 are multiplexed in a multiplexer 60 and this is then supplied to a further low-pass filter 62 and to a bandpass filter 64 in another branch, which are followed by respective analog/digital converters 66 and 68. This evaluation is illustrated in detail in FIG. 11B, wherein the indication "HW" and "SW" in FIG. 11B is used to show which units are present in the form of hardware "HW", that is to say physical assemblies, and which units are provided by software "SW", that is to say in a computing unit. The multiplexer 60 can also be provided by two multiplexing units in order to reduce measuring times. Instead of two analog/digital converters 66 and 68, it is also possible to use an individual analog/digital converter with a further multiplexer connected upstream.

In a slight modification of FIG. 11A, FIG. 11B illustrates the bandpass filter at a later time; see unit 64' with the low-pass filter 62' in the parallel branch. The unit 70 then determines the corresponding variables at the angles 0°, 90°, 180° and 270° and the unit 72 calculates the variables Rdc, Rs and Ls.

The previously described method is used to determine the properties of the coil 1 which are present according to the model illustrated in FIG. 2, that is to say the resistances Rdc, Rs and the inductance Ls. The inductance Ls is still dependent on Cp.

Figure 12:
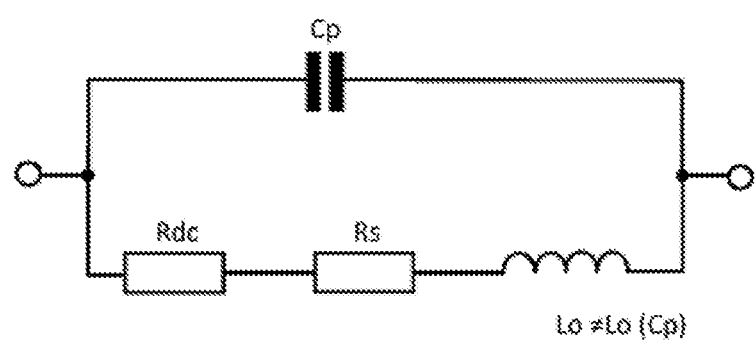
FIG. 12 shows a modified equivalent circuit diagram for a measuring coil provided in accordance with the principle according to FIG. 2.

In order to reliably measure the travel, that is to say to precisely determine the position of the actuation member 2, other variables are now calculated in accordance with the model according to FIG. 12. In this case, there is an inductance L0 which is not dependent on Cp, and the dependence on Cp is found in the other variables.

The impedance of the coil can be represented according to FIG. 12 as:

$$Z = \frac{1}{\frac{1}{Rdc + Rs + j\omega Lo} + j\omega Cp} \quad (7)$$

The idea used when determining the theoretical inductance L0 involves measuring the inductance at different frequencies ω1 and ω2. In the case of ω1, the formula for the inductance is:

$$Z_1 = \frac{1}{\frac{1}{Rdc + Rs + j\omega_1 Lo} + j\omega_1 Cp} \quad (8)$$

and, in the case of ω2, it is:

$$Z_2 = \frac{1}{\frac{1}{Rdc + Rs + j\omega_2 Lo} + j\omega_2 Cp}. \quad (9)$$

If Rdc=Rs=0 is now set in an approximation, the following variables are obtained for the imaginary part of the impedance $Z_1$ and of the impedance $Z_2$:

$$\mathrm{Im}\{Z_1\} = \frac{1}{\frac{1}{\omega_1 Lo} + j\omega_1 Cp} \quad (10)$$

$$\mathrm{Im}\{Z_2\} = \frac{1}{\frac{1}{\omega_2 Lo} + j\omega_2 Cp}. \quad (11)$$

This can be solved according to L0 and the following formula is obtained:

$$L0 = \frac{\mathrm{Im}\{Z_1\} \cdot \mathrm{Im}\{Z_2\} \cdot \left(\frac{\omega_1}{\omega_2} + \frac{\omega_2}{\omega_1}\right)}{\omega_2 \mathrm{Im}\{Z_2\} - \omega_1 \mathrm{Im}\{Z_1\}}. \quad (12)$$

It is clear in the examples above that, if the first measuring frequency ω1 is 25 kHz for example, the second measuring frequency ω2 relates to the third harmonic, that is to say 75 kHz, and the sampling is carried out at 100 kHz. A third measuring frequency could in theory be five times the first measuring frequency, that is to say 125 kHz. A frequency of 25 kHz is also produced in the case of the latter by sampling at 100 kHz, but the sampled values must then be used in a suitable sequence.

The position of the actuation member 2 can now be clearly derived using the determined variable L0 which could be dependent only on the temperature; the temperature dependence can also be additionally compensated for, if necessary, with the aid of Rdc. This makes it possible to use the coil 1 without sealing, that is to say without it having to be protected from moisture.

The above-described measurements of the variables Rdc, Rs and Ls and, following from this, the variable L0 can be carried out in a motor vehicle, for example in a five-minute cycle, a 15-minute cycle or other cycles with a duration of between 1 second and 24 hours, which may be with a duration of between 1 second and 1 hour. If a corresponding pedal 3 is actuated, the respective current value for the capacitance Cp, which is dependent on moisture possibly ingressing into the coil 1, is thus reliably taken into account.

In a modification of FIG. 1, an actuation member 2' on a pedal 3 can also surround a coil 1', wherein the extent to which the actuation member 2' surrounds the coil 1' is varied by actuating the pedal 3. The actuation member 2' is therefore slid over the coil 1'.

Figure 13:
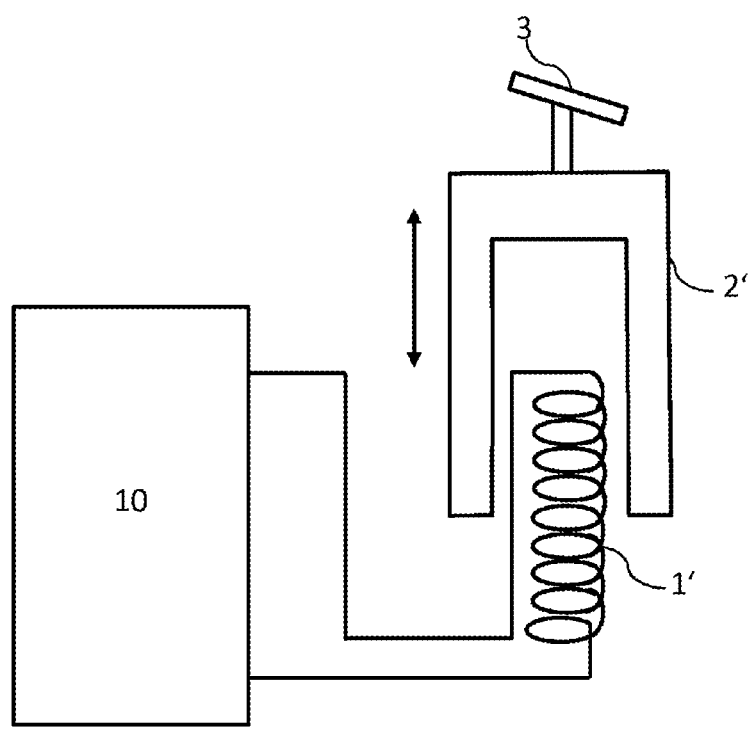
FIG. 13 shows a modification of the principle of travel measurement according to FIG. 1.

In a further modification in an embodiment which is not shown, it would also be possible to combine the principles according to FIG. 1 and FIG. 13, that is to say an inner section of an actuation member can penetrate the coil and an outer section can surround the coil and can be slid over the latter.

Instead of being arranged on a pedal 3, the actuation member 2 or 2' can also be arranged on a handle or another mechanically displaceable unit as an actuation element.

Although the present invention has been described in detail on the basis of the exemplary embodiments, the invention is not restricted to these exemplary embodiments, but rather deviations are possible such that individual features can be omitted or other combinations of features can be implemented as long as the scope of protection of the accompanying claims is not left. The present disclosure concomitantly includes all combinations of the individual features presented.

In particular, measured values can be sampled at 360°/n, where n is a natural number and n>4. The above equations can then be replaced with the corresponding equations matching n.

The invention claimed is:

1. A method for measuring at least one property of a coil, which includes a measuring coil used during measurements of other variables, the coil being modeled as a parallel circuit including a capacitance with a series circuit including a DC voltage resistance, a frequency-dependent resistance, and an inductance, and a current-voltage converter connected in series, the method comprising:
   a) applying an AC voltage, having a first frequency and having a DC voltage component which differs from zero, to the coil and a voltage at the current-voltage converter is captured at a second frequency which is a multiple of the first frequency, wherein the multiple, as an n-tuple where n is a natural number, is at least four, and the impedance and the phase angle at the first frequency are derived from at least n measured values captured in succession in this manner; and
   b) applying an AC voltage, having a third frequency which differs from the first frequency and having a DC voltage component which differs from zero, to the coil and the voltage at the current-voltage converter is captured at the second frequency or at a fourth frequency which is a multiple of the first frequency, wherein the multiple, as an m-tuple with a natural number, is at least four, and the impedance and the phase angle at the third frequency are derived from at least m measured values captured in succession in this manner;
   wherein at least one of the values for the DC voltage resistance, the frequency-dependent resistance, and the inductance is derived from the two impedances and from the two phase angles, and
   wherein the measuring coil is for measuring a position of an actuation member, the actuation member plunging into the measuring coil in at least one measurable position, and wherein the position of the actuation member is derived from an inductance of the measuring coil, wherein the imaginary part of the impedances (Zi, Z2) of the measuring coil is determined at at least two different frequencies (ω1, ω2) and an ideal inductance (LO) independent of a capacitance (Cp) of the measuring coil is determined therefrom and the position is derived using the ideal inductance (LO),
   wherein the actuation member is movable back and forth via a pedal in a motor vehicle,
   wherein a system for measuring the at least one property of the coil includes a voltage generator generates a square-wave voltage, which is passed through a filter that is a low-pass filter or a band pass filter, an output outputs a generator voltage, wherein the voltage is tapped off at a tap of a processor upstream of the filter, wherein a frequency divider, which is coupled between the voltage generator and the filter, is followed by an output to another tap of the processor, where an unfiltered voltage is tapped off, wherein the current-voltage converter is connected in series with the coil which has a converter output, wherein the current-voltage converter is followed by the filter, wherein the processor receives the voltages at the taps of the processor, wherein the processor controls signals supplied to an analog/digital converter, for sampling at angular spacings, which is supplied with the square-wave voltage, wherein the processor configured to calculate the inductance and the frequency-dependent resistance, and wherein the DC voltage component which differs from zero is impressed on the system because of the square-wave voltage.

2. The method of claim 1, wherein the AC voltage in tasks a) and b) respectively includes a sinusoidal voltage, wherein the voltages differ from one another in terms of their frequency.

3. The method of claim 2, wherein in task b), the third frequency is three times the first frequency in task a).

4. The method of claim 1, wherein the same square-wave voltage is respectively generated in tasks a) and b) and is passed through different filters in tasks a) and b).

5. The method of claim 1, wherein the voltage at the current-voltage converter is captured in phase with the applied AC voltage.

6. The method of claim 1, wherein $\text{Im}\{Z_1\}$ is the imaginary part of the impedance $Z_1$ measured at a first frequency $\omega_1$ on and $\text{Im}\{Z_2\}$ is the imaginary part of the impedance $Z_2$ measured at a second frequency $\omega_2$ and the ideal inductance (L0) results as:

$$L0 = \frac{\text{Im}\{Z_1\} \cdot \text{Im}\{Z_2\} \cdot \left(\frac{\omega_1}{\omega_2} + \frac{\omega_2}{\omega_1}\right)}{\omega_2 \text{Im}\{Z_2\} - \omega_1 \text{Im}\{Z_1\}}.$$

7. The method of claim 1, wherein the ideal inductance is temperature-dependent, the temperature is measured, and the measured value for the temperature is used when determining the position.

8. The method of claim 1, wherein the value for the DC voltage resistance and the value for the frequency-dependent resistance are also used when determining the position.

9. A device for measuring at least one property of a coil, which is a measuring coil, comprising:
a current-voltage converter, which includes a measuring resistor connected in series with the coil;
a generator for inputting an AC voltage which has a DC voltage component;
a frequency converter;
a sampling circuit for providing the output signal from the current-voltage converter, wherein the sampling circuit carries out sampling in phase with the input AC voltage at a multiple of the frequency of the input AC voltage, wherein the multiple is at least four; and
an evaluation device which is supplied with the measured values sampled by the sampling circuit and, by modeling the coil as a parallel circuit including a capacitance with a series circuit including a DC voltage resistance, a frequency-dependent resistance and an inductance, calculates at least one of the value for the DC voltage resistance, the frequency-dependent resistance and the inductance;

wherein the measuring coil is for measuring a position of an actuation member on a pedal in a motor vehicle, the actuation member plunging into the measuring coil in at least one measurable position, and wherein the position of the actuation member is derived from an inductance of the measuring coil, wherein the imaginary part of the impedances ($Z_1$, $Z_2$) of the measuring coil is determined at at least two different frequencies ($\omega_1$, $\omega_2$) and an ideal inductance (L0) independent of a capacitance (Cp) of the measuring coil is determined therefrom and the position is derived using the ideal inductance (L0), and wherein the actuation member is movable back and forth via the pedal in the motor vehicle, wherein a system for measuring the at least one property of the coil includes a voltage generator generates a square-wave voltage, which is passed through a filter that is a low-pass filter or a band pass filter, an output outputs a generator voltage, wherein the voltage is tapped off at a tap of a processor upstream of the filter, wherein a frequency divider, which is coupled between the voltage generator and the filter, is followed by an output to another tap of the processor, where an unfiltered voltage is tapped off, wherein the current-voltage converter is connected in series with the coil which has a converter output, wherein the current-voltage converter is followed by the filter, wherein the processor receives the voltages at the taps of the processor, wherein the processor controls signals supplied to an analog/digital converter, for sampling at angular spacings, which is supplied with the square-wave voltage, wherein the processor configured to calculate the inductance and the frequency-dependent resistance, and wherein the DC voltage component which differs from zero is impressed on the system because of the square-wave voltage.

10. The device of claim 9, wherein the frequency converter includes a frequency divider which can be optionally switched on.

11. The device of claim 9, wherein the sampling circuit includes a low-pass filter downstream of the output of the frequency converter and downstream of the output of the current-voltage converter, and the outputs of both low-pass filters are supplied to a multiplexer, the output of which is supplied to an analog/digital converter, the output of which is supplied to a microprocessor as an evaluation device.

12. The device of claim 9, wherein the sampling circuit jointly supplies the output signal from the frequency converter and from the current-voltage converter to a multiplexer, the output signal from which first of all passes through a low-pass filter, the output of which is supplied to a first analog/digital converter, the output of which is in turn supplied to a microprocessor as an evaluation device, wherein the output signal from the multiplexer is secondly supplied to a bandpass filter, the output signal from which is supplied to the first or a second analog/digital converter, the output signal from which is in turn supplied to the microprocessor.

* * * * *